US011792991B2

(12) United States Patent
Tessariol et al.

(10) Patent No.: US 11,792,991 B2
(45) Date of Patent: Oct. 17, 2023

(54) MEMORY ARRAYS AND METHODS USED IN FORMING A MEMORY ARRAY COMPRISING STRINGS OF MEMORY CELLS

(71) Applicant: Micron Technology, Inc., Boise, ID (US)

(72) Inventors: Paolo Tessariol, Arcore (IT); Justin B. Dorhout, Boise, ID (US); Jian Li, Boise, ID (US); Ryan L. Meyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/567,287

(22) Filed: Jan. 3, 2022

(65) Prior Publication Data
US 2022/0130857 A1   Apr. 28, 2022

Related U.S. Application Data

(62) Division of application No. 16/550,244, filed on Aug. 25, 2019, now Pat. No. 11,244,955.

(51) Int. Cl.
| | |
|---|---|
| *H01L 21/768* | (2006.01) |
| *H01L 23/522* | (2006.01) |
| *H10B 43/27* | (2023.01) |
| *H01L 23/528* | (2006.01) |
| *H10B 41/27* | (2023.01) |

(Continued)

(52) U.S. Cl.
CPC ....... *H10B 43/27* (2023.02); *H01L 21/76816* (2013.01); *H01L 21/76877* (2013.01); *H01L 23/5226* (2013.01); *H01L 23/5283* (2013.01); *H10B 41/27* (2023.02); *H10B 41/35* (2023.02); *H10B 43/35* (2023.02)

(58) Field of Classification Search
None
See application file for complete search history.

(56) References Cited

U.S. PATENT DOCUMENTS

| | | |
|---|---|---|
| 9,997,353 B1 | 6/2018 | Kumar et al. |
| 10,290,643 B1 | 5/2019 | Kai et al. |

(Continued)

FOREIGN PATENT DOCUMENTS

| | | |
|---|---|---|
| WO | WO 2020/252892 | 12/2020 |

OTHER PUBLICATIONS

WO PCT/US2020/045841 IPRP, dated Mar. 1, 2022, Micron Technology, Inc.

(Continued)

*Primary Examiner* — Xiaoming Liu
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Insulative pillars are laterally-between and longitudinally-spaced-along immediately-laterally-adjacent of the memory blocks. The pillars are directly against conducting material of conductive lines in the conductive tiers. Other arrays, and methods, are disclosed.

20 Claims, 17 Drawing Sheets

(51) Int. Cl.
*H10B 41/35* (2023.01)
*H10B 43/35* (2023.01)

(56) References Cited

U.S. PATENT DOCUMENTS

| | | |
|---|---|---|
| 2012/0098050 A1 | 4/2012 | Shim et al. |
| 2012/0168829 A1 | 7/2012 | Zhong et al. |
| 2012/0208347 A1* | 8/2012 | Hwang ............... H01L 29/7889 257/E21.546 |
| 2015/0206900 A1* | 7/2015 | Nam ................. H01L 27/11582 438/269 |
| 2015/0214241 A1 | 7/2015 | Lee |
| 2015/0303214 A1 | 10/2015 | Kim et al. |
| 2015/0340377 A1* | 11/2015 | Lee ................... H01L 27/11578 257/314 |
| 2016/0049421 A1 | 2/2016 | Zhang et al. |
| 2016/0336338 A1 | 11/2016 | Song et al. |
| 2016/0336340 A1 | 11/2016 | Song et al. |
| 2016/0343726 A1 | 11/2016 | Yune |
| 2017/0148805 A1 | 5/2017 | Nishikawa et al. |
| 2017/0250193 A1* | 8/2017 | Huo ..................... H01L 21/3247 |
| 2017/0256645 A1 | 9/2017 | Chung et al. |
| 2018/0130814 A1* | 5/2018 | Lee ................... H01L 27/11568 |
| 2018/0261616 A1 | 9/2018 | Cho et al. |
| 2019/0393238 A1 | 12/2019 | Lim et al. |
| 2020/0119036 A1 | 4/2020 | King et al. |
| 2020/0312863 A1 | 10/2020 | Iwai et al. |
| 2021/0043640 A1 | 2/2021 | Kawaguchi et al. |
| 2021/0202324 A1 | 7/2021 | Scarbrough et al. |

OTHER PUBLICATIONS

WO PCT/US2020/045841 Search Rep., dated Nov. 23, 2020, Micron Technology, Inc.
WO PCT/US2020/045841 Writt. Opin., dated Nov. 23, 2020, Micron Technology, Inc.

* cited by examiner

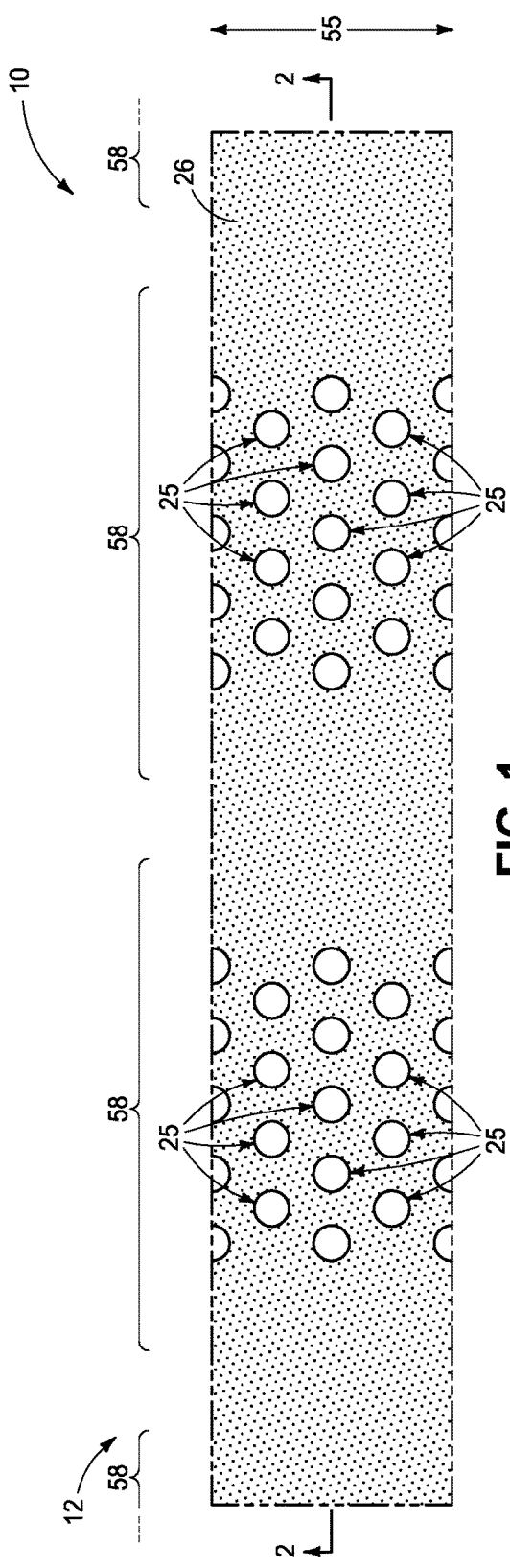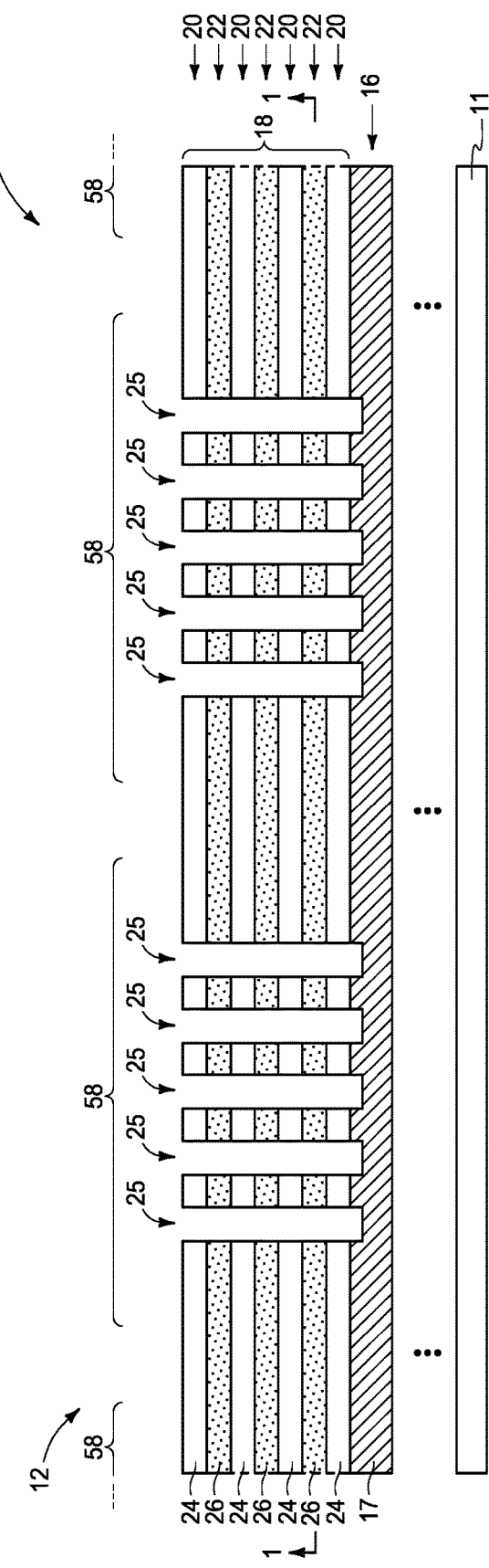

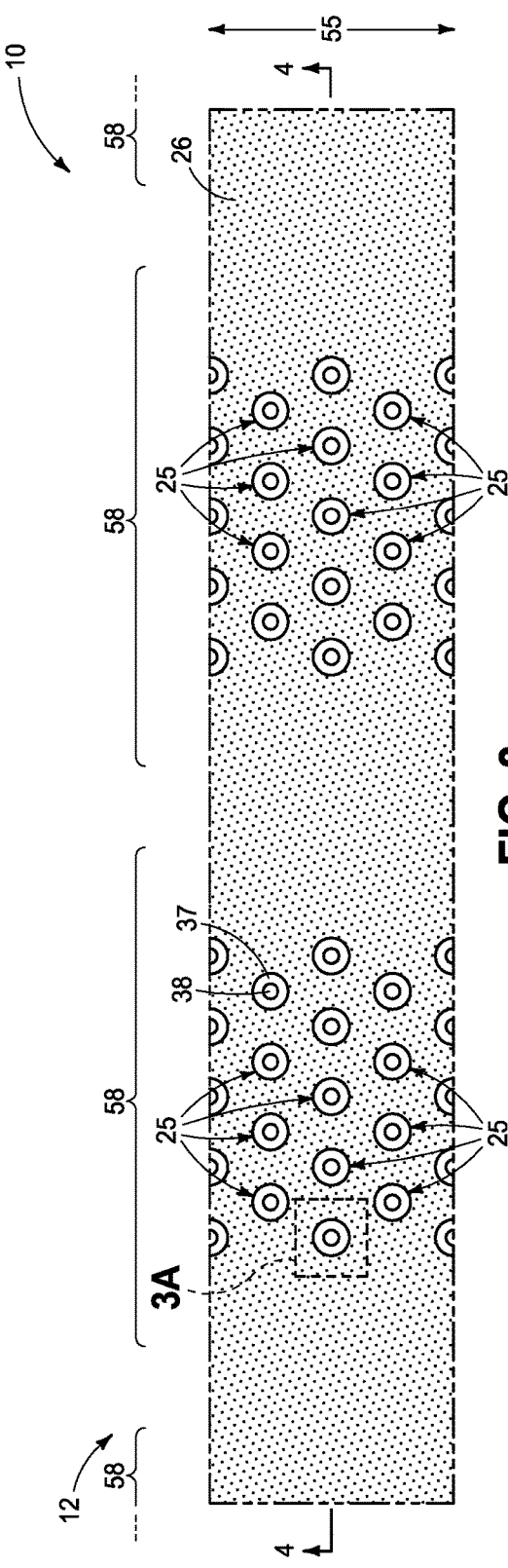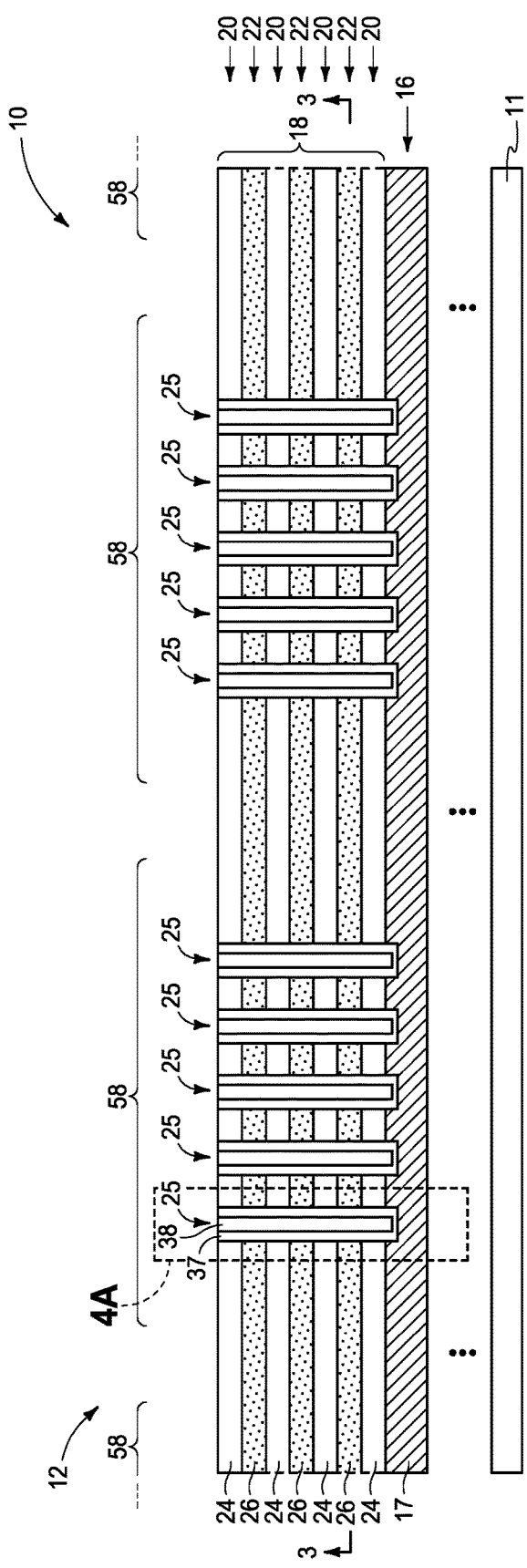

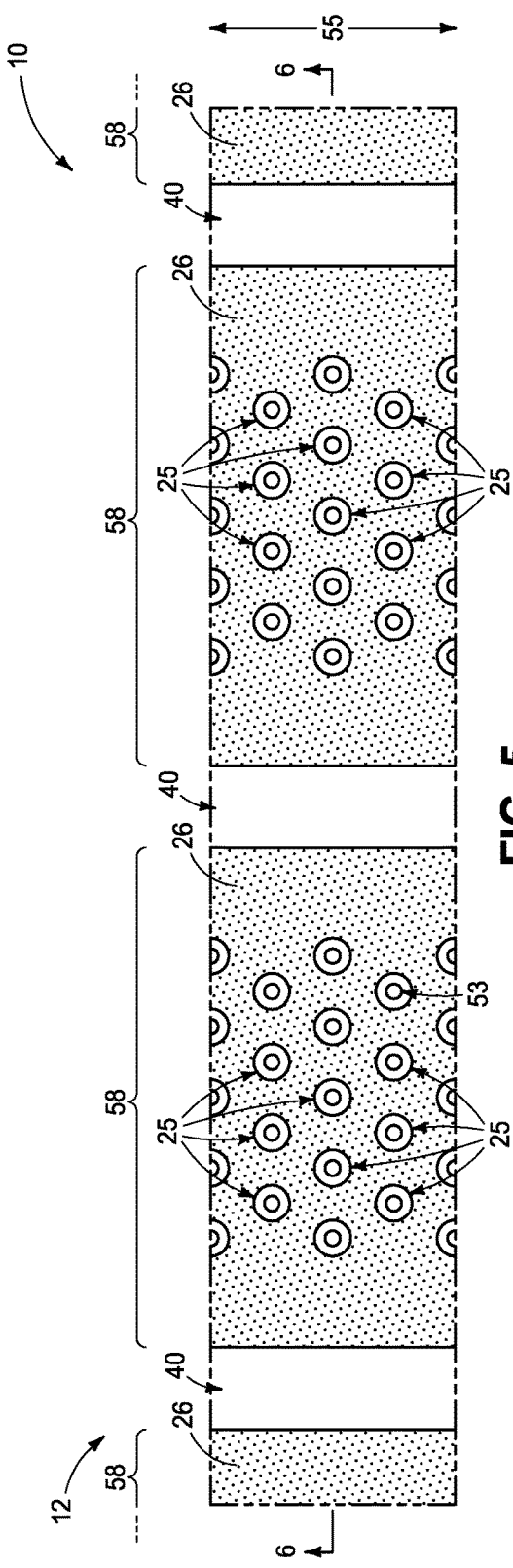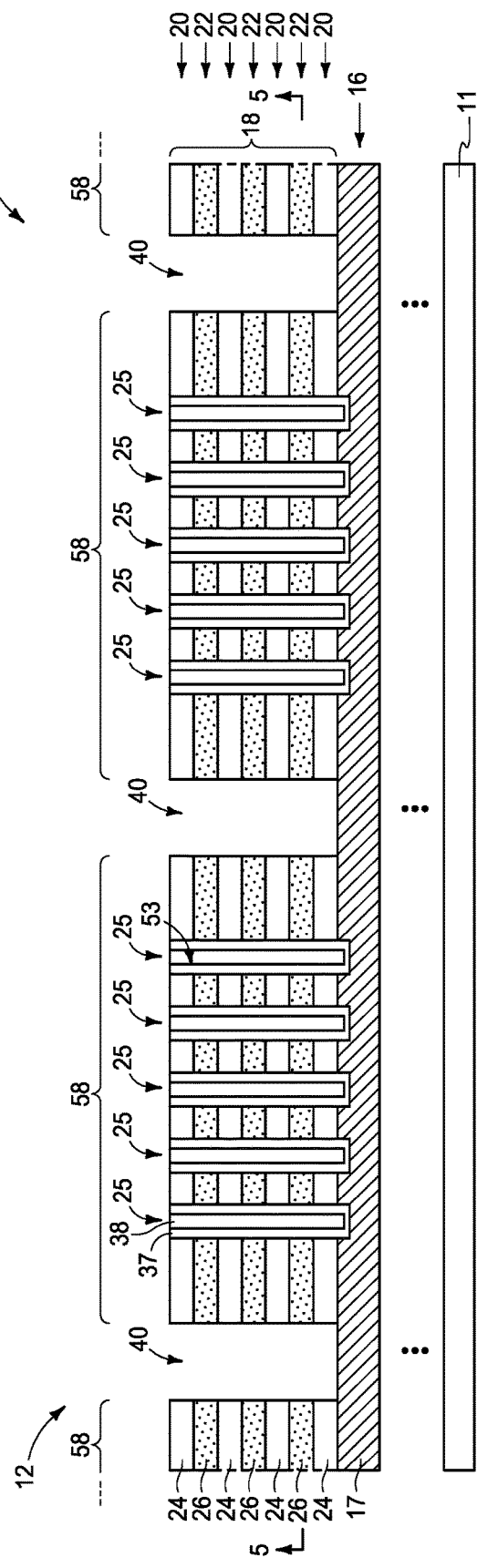
FIG. 5
FIG. 6

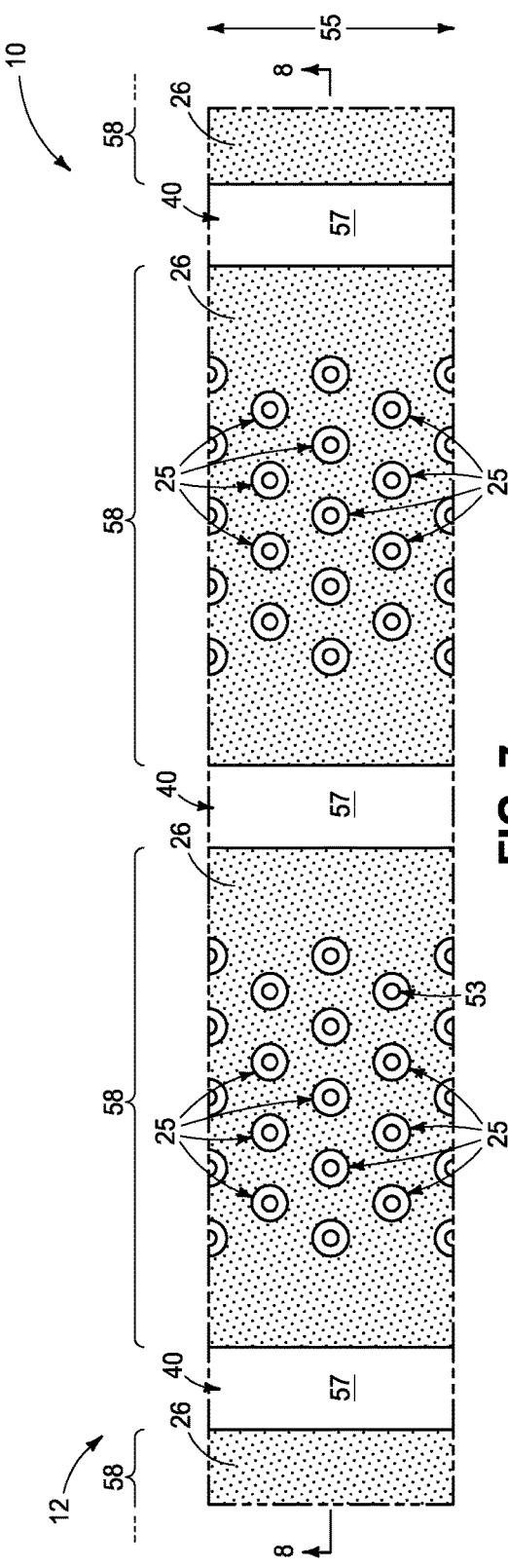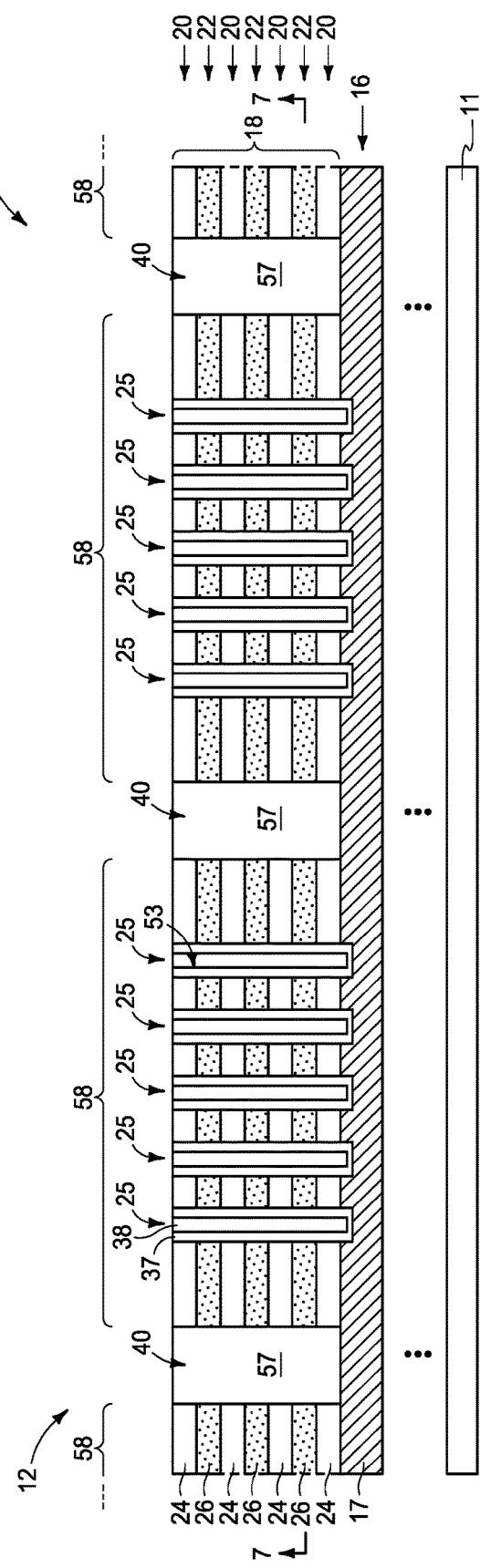
FIG. 7
FIG. 8

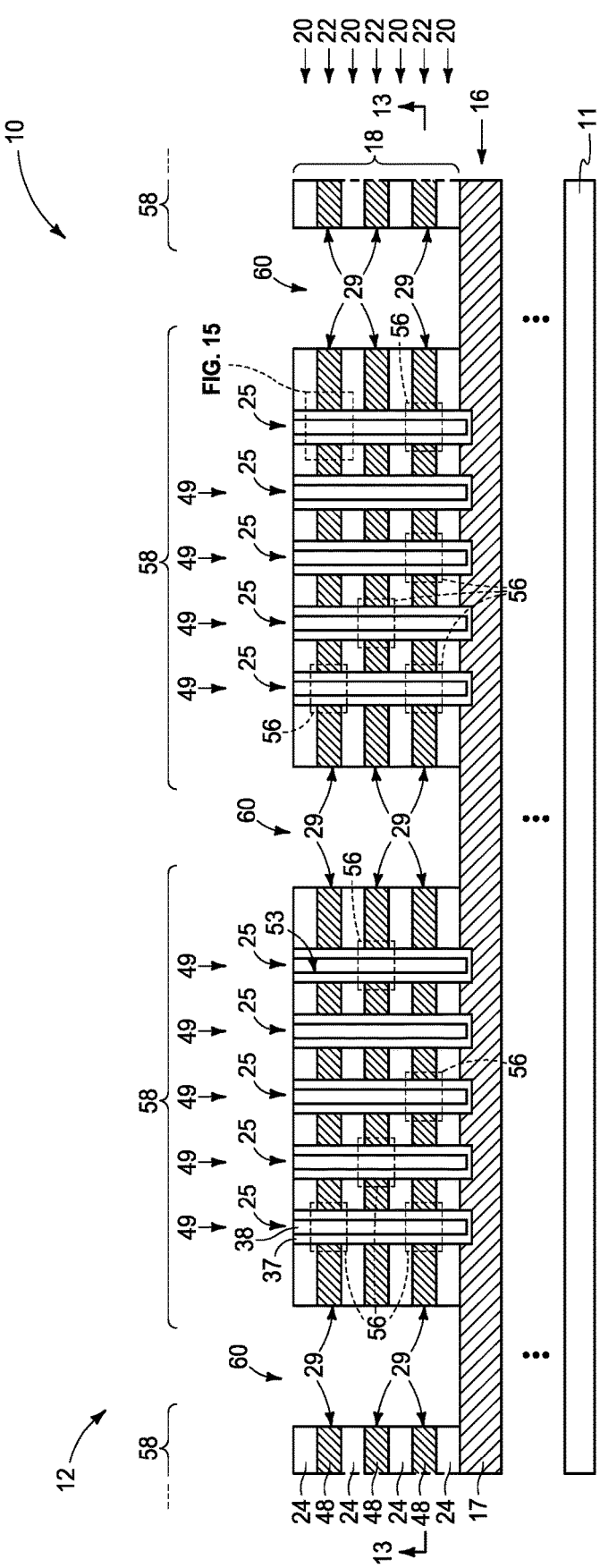
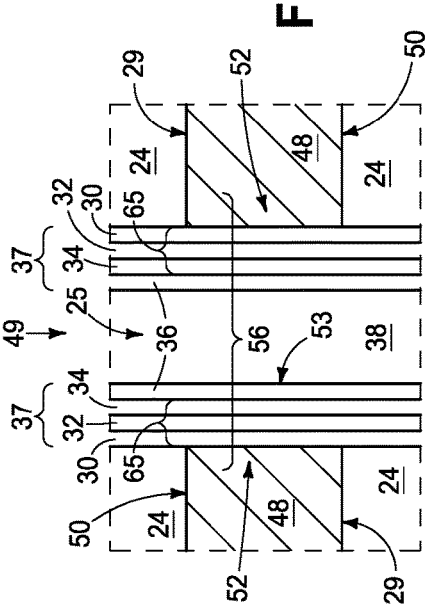
FIG. 14
FIG. 15

MEMORY ARRAYS AND METHODS USED IN FORMING A MEMORY ARRAY COMPRISING STRINGS OF MEMORY CELLS

RELATED PATENT DATA

This patent resulted from a divisional application of U.S. patent application Ser. No. 16/550,244, filed Aug. 25, 2019, entitled "Memory Arrays And Methods Used In Forming A Memory Array Comprising Strings Of Memory Cells", naming Paolo Tessariol, Justin B. Dorhout, Jian Li, and Ryan L. Meyer as inventors, the disclosure of which is incorporated by reference.

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Nonvolatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833, and which are hereby and herein fully incorporated by reference and aspects of which may be used in some embodiments of the inventions disclosed herein. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 3-21 are diagrammatic sequential sectional and/or enlarged views of the construction of FIGS. 1 and 2, or portions thereof, in process in accordance with some embodiments of the invention.

DETAILED DESCRIPTION OF EXAMPLE EMBODIMENTS

Figure 4A:
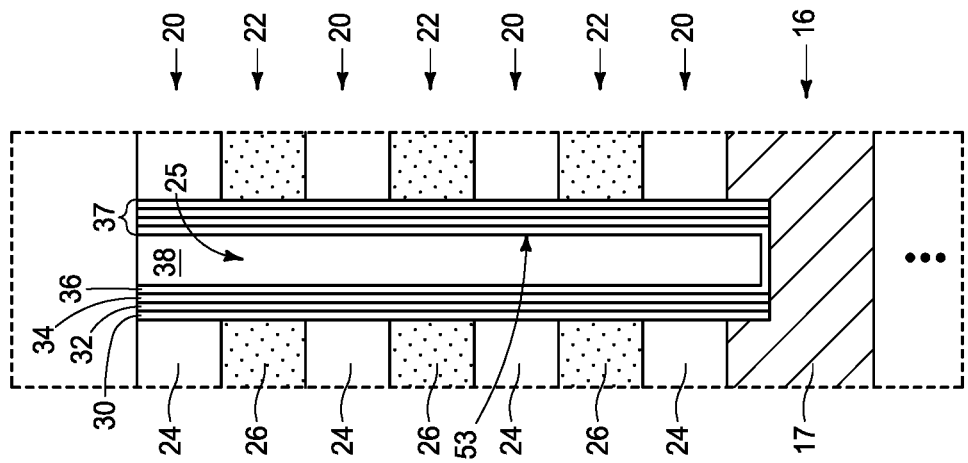
Figure 3A:
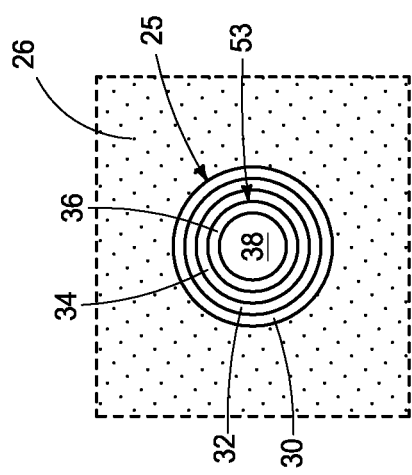

Some aspects of the invention were motivated in overcoming problems associated with so-called "block-bending" (a block stack tipping/tilting sideways relative to its longitudinal orientation during fabrication), although the invention is not so limited.

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture.

Example method embodiments are described with reference to FIGS. 1-21 which may be considered as a "gate-last" or "replacement-gate" process.

FIGS. 1 and 2 show a construction 10 having an array or array area 12 in which elevationally-extending strings of transistors and/or memory cells will be formed, Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductive material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial.

Channel openings 25 have been formed (e.g., by etching) through insulative tiers 20 and conductive tiers 22 to conductor tier 16. In some embodiments, channel openings 25 may go partially into conductive material 17 of conductor tier 16 as shown or may stop there-atop (not shown). Alternately, as an example, channel openings 25 may stop atop or within the lowest insulative tier 20. A reason for extending channel openings 25 at least to conductive material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial. By way example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e,g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 3, 3A, 4 and 4A show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to a top surface of stack 18. Channel material 36 has also been formed in channel openings 25 elevationally along insulative tiers 20 and conductive tiers 22, thus comprising individual operative channel-material strings 53. Materials 30, 32, 34, and 36 are collectively shown as and only designated as material 37 in FIGS. 3 and 4 due to scale. Example channel materials 36 include appropriately-doped crystalline semiconductor material, such as one or more silicon, germanium, and so-called MN semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Conductive plugs (not shown) may be formed atop channel material strings 53 for better conductive connection to overlying circuitry (not shown).

Referring to FIGS. 5 and 6, horizontally-elongated trenches 40 have been formed (e,g., by anisotropic etching) into stack 18 to form laterally-spaced memory-block regions 58. Horizontally-elongated trenches 40 may have respective bottoms that are directly against conductive material 17 (e.g., atop or within) of conductor tier 16 (as shown) or may have respective bottoms that are above conductive material 17 of conductor tier 16 (not shown).

The above processing shows forming and filling channel openings 25 prior to forming trenches 40. Such could be reversed. Alternately, trenches 40 could be formed in between the forming and filling of channel openings 25 (not ideal).

Referring to FIGS. 7 and 8, fill material 57 has been formed in horizontally-elongated trenches 40. If such material is to remain in the finished circuitry construction, it should be non-conductive at least at and along laterally-outermost edges of trenches 40. If entirely sacrificial, any material regardless of conductivity may be used. Example insulative materials include silicon dioxide, aluminum dioxide, hafnium silicon oxide, etc. If processing in accordance with gate-last formation, fill material 57 should be of a composition different from that of material 26 such that material 26 can be etched selectively relative to fill material 57. If for example material 26 comprises a composition other than silicon nitride, fill material 57 may comprise silicon nitride. Alternately, by way of example only, fill material 57 may comprise silicon nitride if the processing is gate-first. If gate-first, horizontally-elongated trenches would be formed through conductive material (not shown) of conductive tiers 22.

Figure 9:
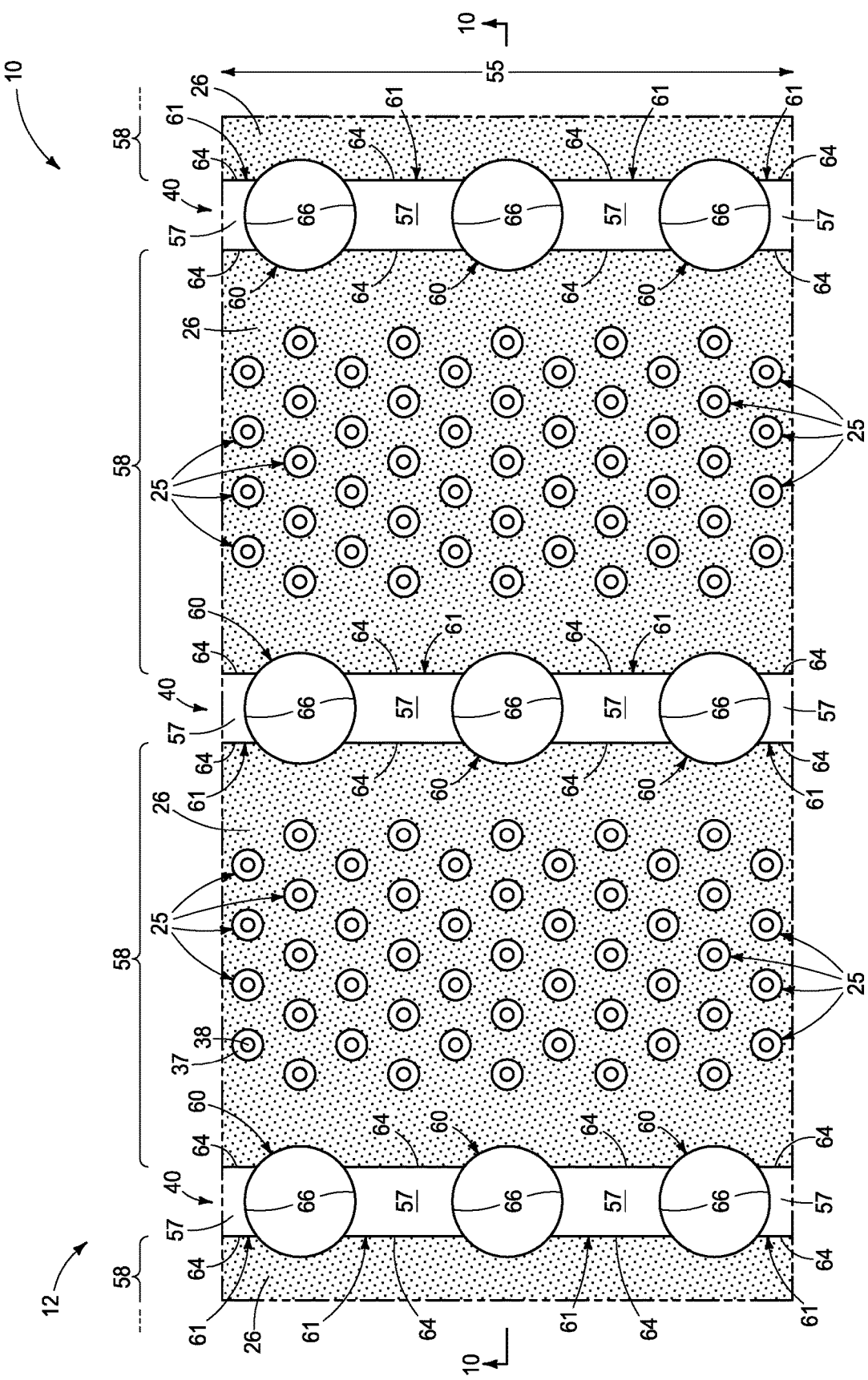
Figure 10:
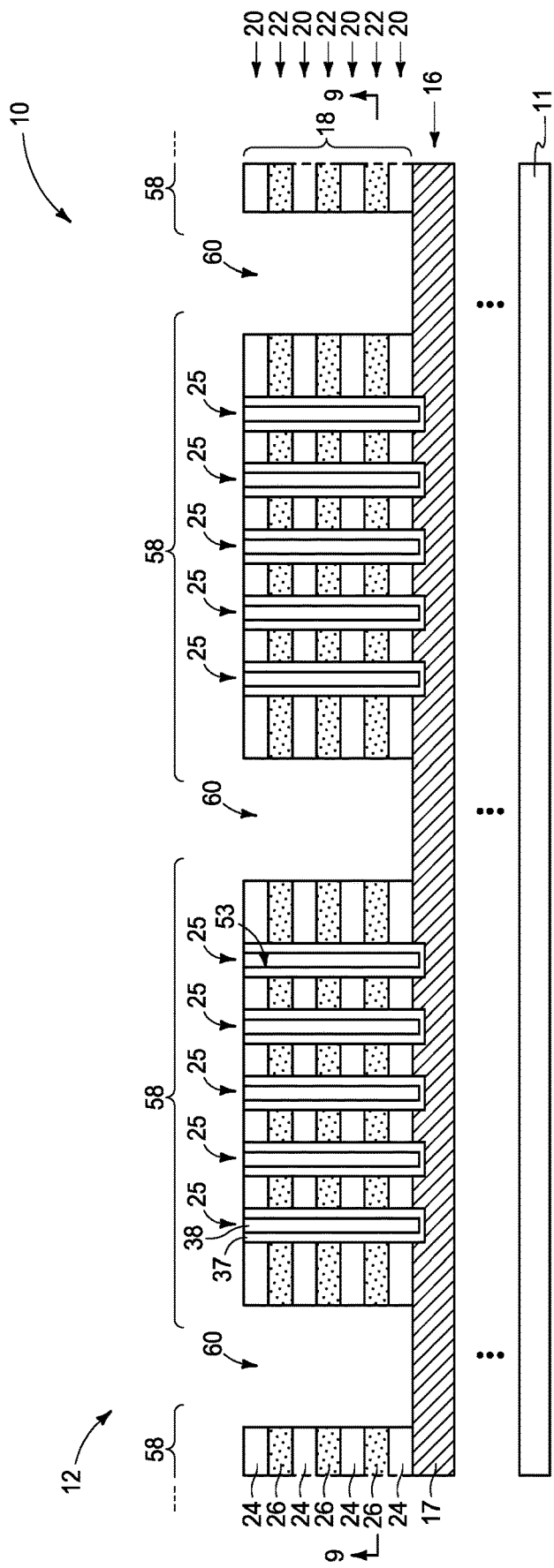

Referring to FIGS. 9 and 10, elevationally-extending holes 60 have been formed (e.g., by photolithographic processing and anisotropic dry etching) into fill material 57. Holes 60 are longitudinally-spaced-along immediately-laterally-adjacent memory-block regions 58. In one embodiment, holes 60 are formed to be vertical or within 10° of vertical. In one embodiment, holes 60 are of circular shape in a horizontal cross-section (e.g., the cross-section that is FIG. 9). Regardless, holes 60 extend laterally all across individual horizontally-elongated trenches 40 and form insulative pillars 61 that are laterally-between and longitudinally-spaced-along immediately-laterally-adjacent memory-block regions 58 longitudinally-between holes 60. Ideally, holes 60 are formed through all of alternating insulative and conductive tiers 20, 22, respectively. Example pillars 61 are of a quadrilateral shape in the horizontal cross-section. Regardless, and in one embodiment, pillars 61 comprise a pair of laterally-opposing concave sides 66 in a horizontal cross-section. In one embodiment, concave sides 66 are curved, in one such embodiment curved from end-to-end in the horizontal cross-section, and in one such latter embodiment and as shown are of constant radius in the horizontal cross-section. Alternately, concave sides 66 may have no curved portion(s) (e.g., being square, rectangular, triangular, etc., and not shown) or comprise a combination of curved and straight portions (not shown). In one embodiment, pillars 61 comprise a pair of planar laterally-opposing sides 64 in the horizontal cross-section. In one such embodiment, planar laterally-opposing sides 64 are oriented parallel longitudinal orientation (e.g., along direction 55) of their immediately-laterally-adjacent memory-block regions 58. In one embodiment, pillars 61 extend through all of alternating insulative and conductive tiers 20, 22, respectively. In one embodiment, pillars 61 are at least predominately (more than 50% up to and including 100%) of a composition the same as that of insulative tiers 20 and in another embodiment are at least predominately of a composition that is different from that of insulative tiers 20. In one embodiment, pillars 61 are vertical or within 10° of vertical.

Figure 11:
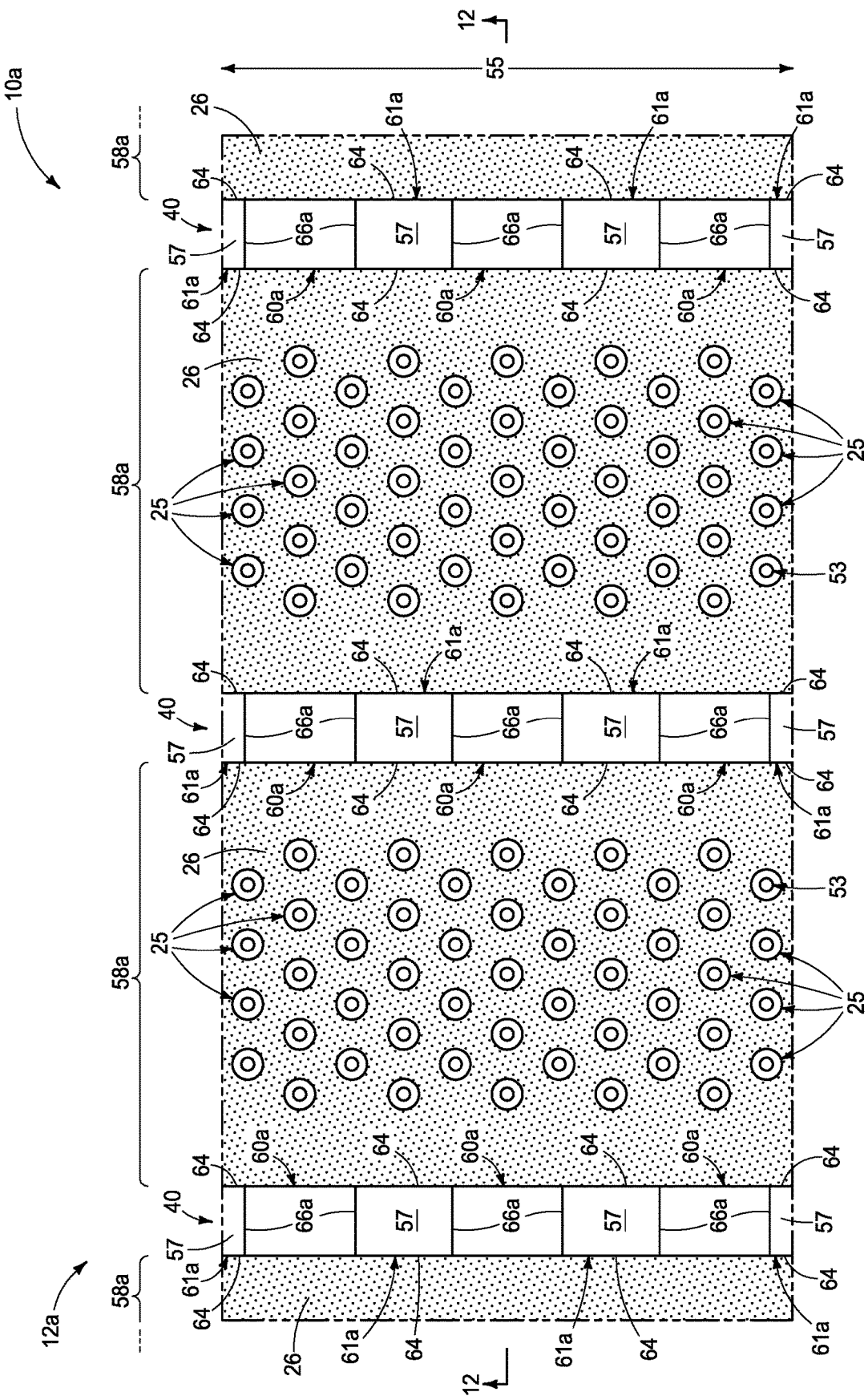
Figure 12:
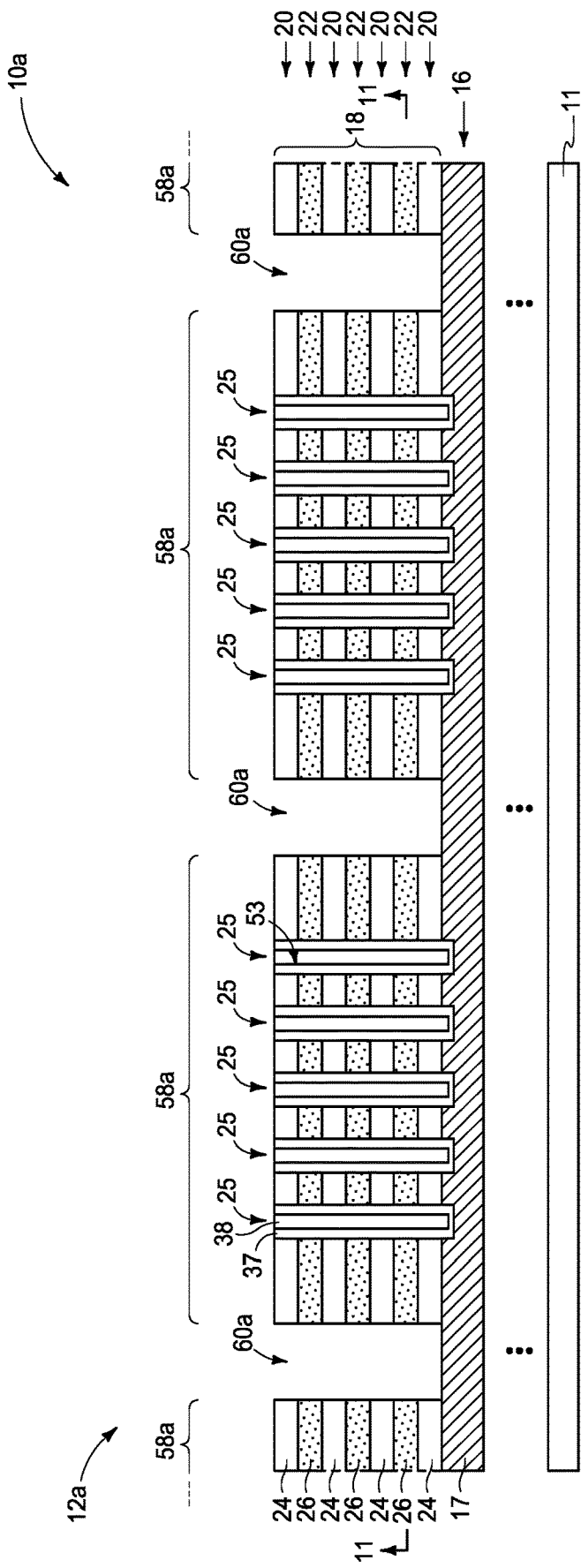

FIGS. 9 and 10 show an example embodiment wherein holes 60 have been formed to extend laterally-beyond fill material 57. FIGS. 11 and 12 show an example alternate embodiment construction 10a of an array 12a comprising memory-block regions 58a wherein holes 60a do not extend laterally beyond fill material 57. Like numerals from the above-described embodiments have been used where appropriate, with some construction differences being indicated with the suffix "a" or with different numerals. Example holes 60a are shown as being of the same width as that of trenches 40 and by way of example only as being quadrilateral (e.g., rectangular) in shape. In one embodiment and as shown, holes 60a have planar laterally-opposing sides 64 that are directly against insulative material 24 of the insulative tiers 20 and in one embodiment that are directly against material 26 of the conductive tiers 22. Sides 66a of pillars 61a are shown as being planar, thereby comprising another pair of planar laterally-opposing sides 66a in the horizontal cross-section in addition to pair of planar laterally-opposing sides 64. Example planar laterally-opposing sides 66a are oriented orthogonal longitudinal orientation (e.g., orthogonal to direction 55) of their immediately-laterally-adjacent memory-block regions 58. Any other attribute(s) or aspect(s) as shown and/or described herein with respect to other embodiments may be used.

Figure 13:
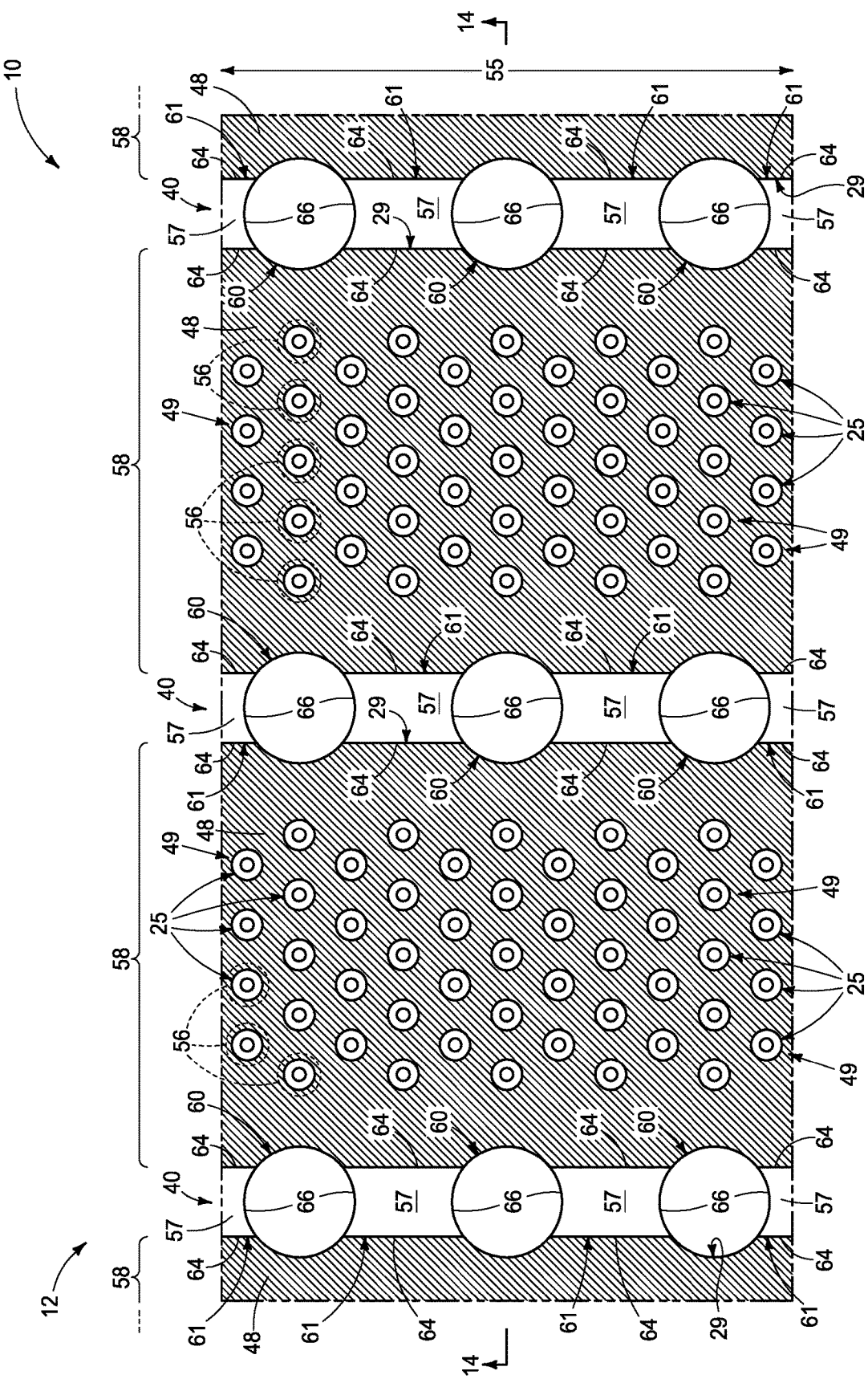

Referring to FIGS. 13-15, and in one embodiment, material 26 (not shown) of conductive tiers 22 has been removed, for example by being isotropically etched away through holes 60 ideally selectively relative to the other exposed materials (e.g., using liquid or vapor $H_3PO_4$ as a primary etchant where material 26 is silicon nitride, and other materials comprise one or more oxides or polysilicon). Material 26 in conductive tiers 22 in the example embodiment is sacrificial and has been replaced with conducting material 48, and which has thereafter been removed from holes 60, thus forming individual conductive lines 29 (e.g., wordlines) and elevationally-extending strings 49 of individual transistors and/or memory cells 56. Conducting material 48 may be laterally recessed back within conductive tiers 22 from laterally-opposing edges of holes 60 (not shown) and also perhaps from laterally-opposing edges of material 57 (not shown) to assure vertical separation of individual conductive lines 29 relative one another. A thin insulative liner (e.g., $Al_2O_3$ and not shown) may be formed before forming conducting material 48. Approximate locations of transistors and/or memory cells 56 are indicated with a bracket in FIG. 15 and some with dashed outlines in FIGS. 13 and 14, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 15) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming holes 60/60a. Alternately, the conducting material of the conductive tiers may be formed before forming holes 60/60a and/or before forming trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conducting material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 16:
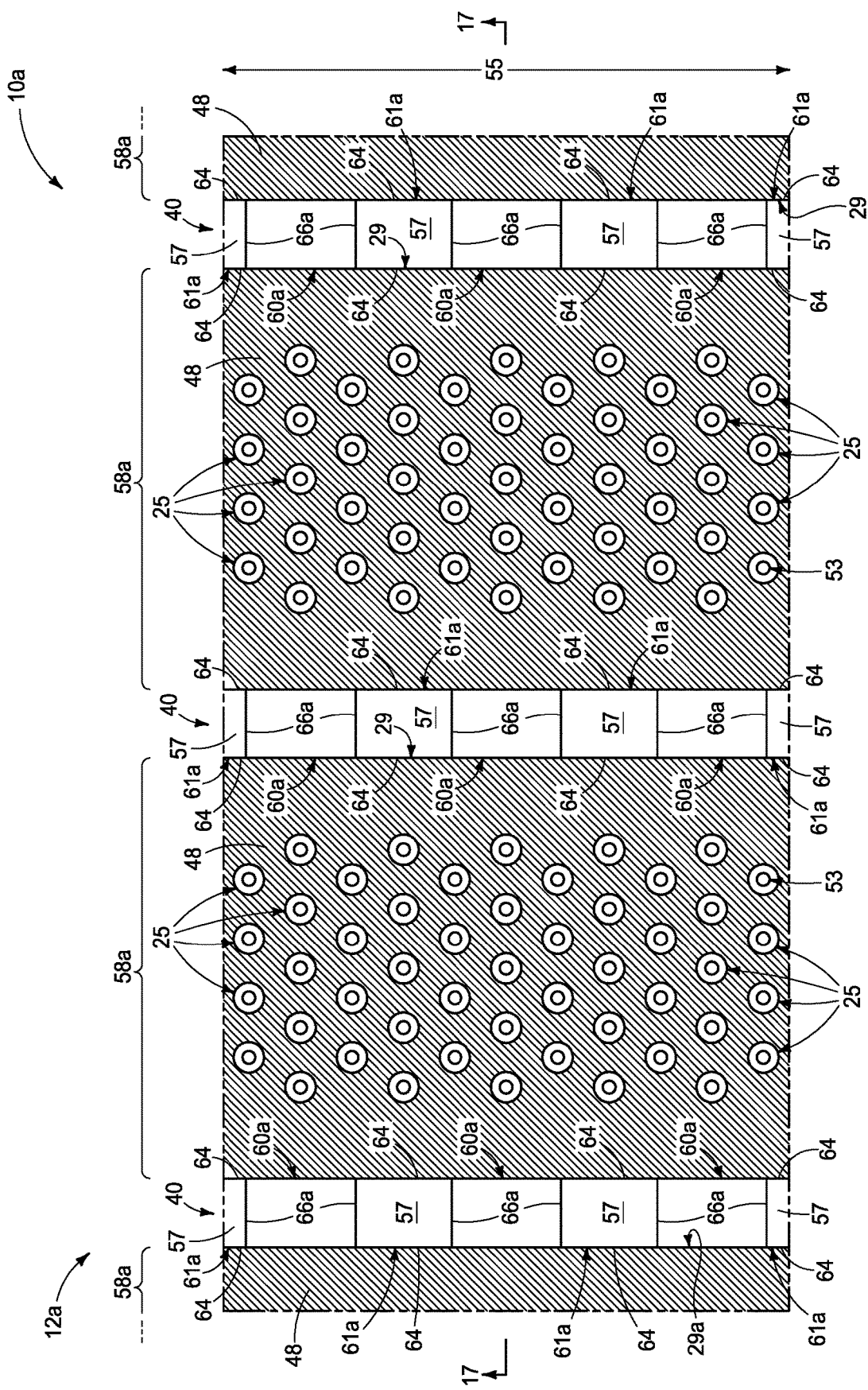
Figure 17:
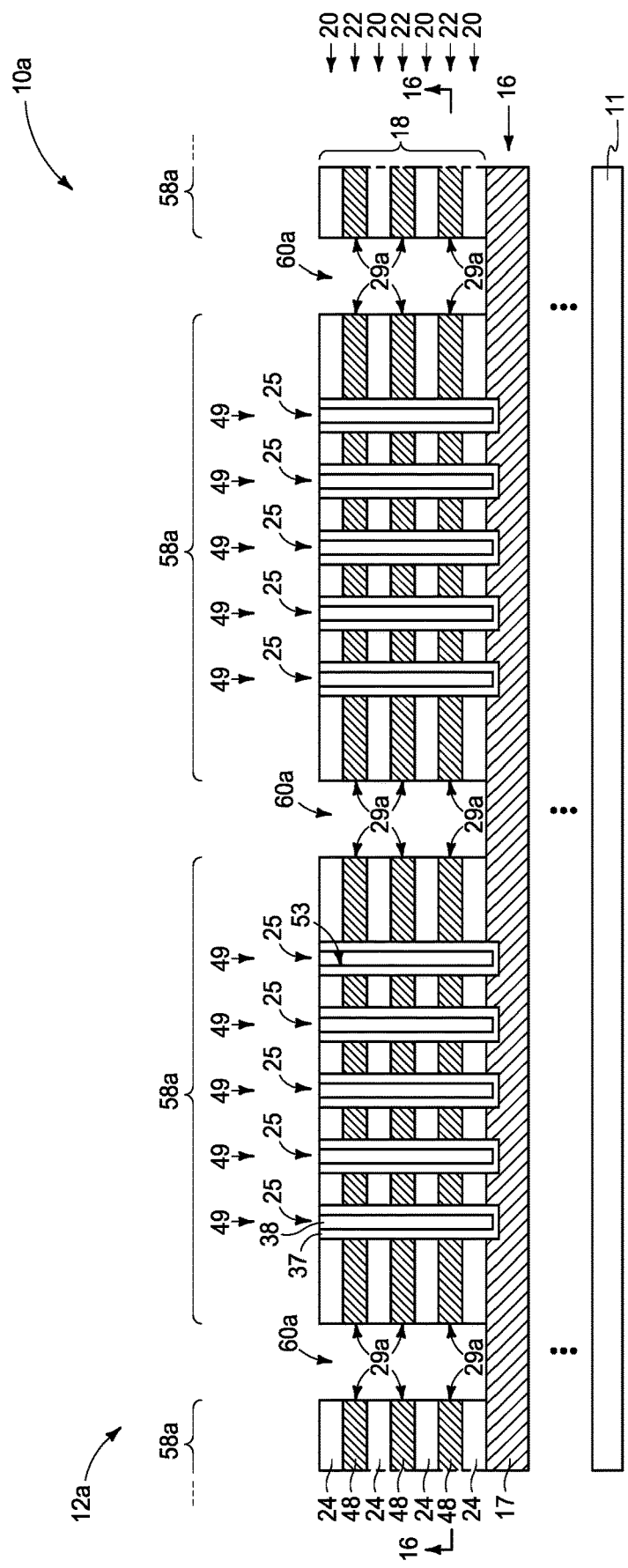
Figure 18:
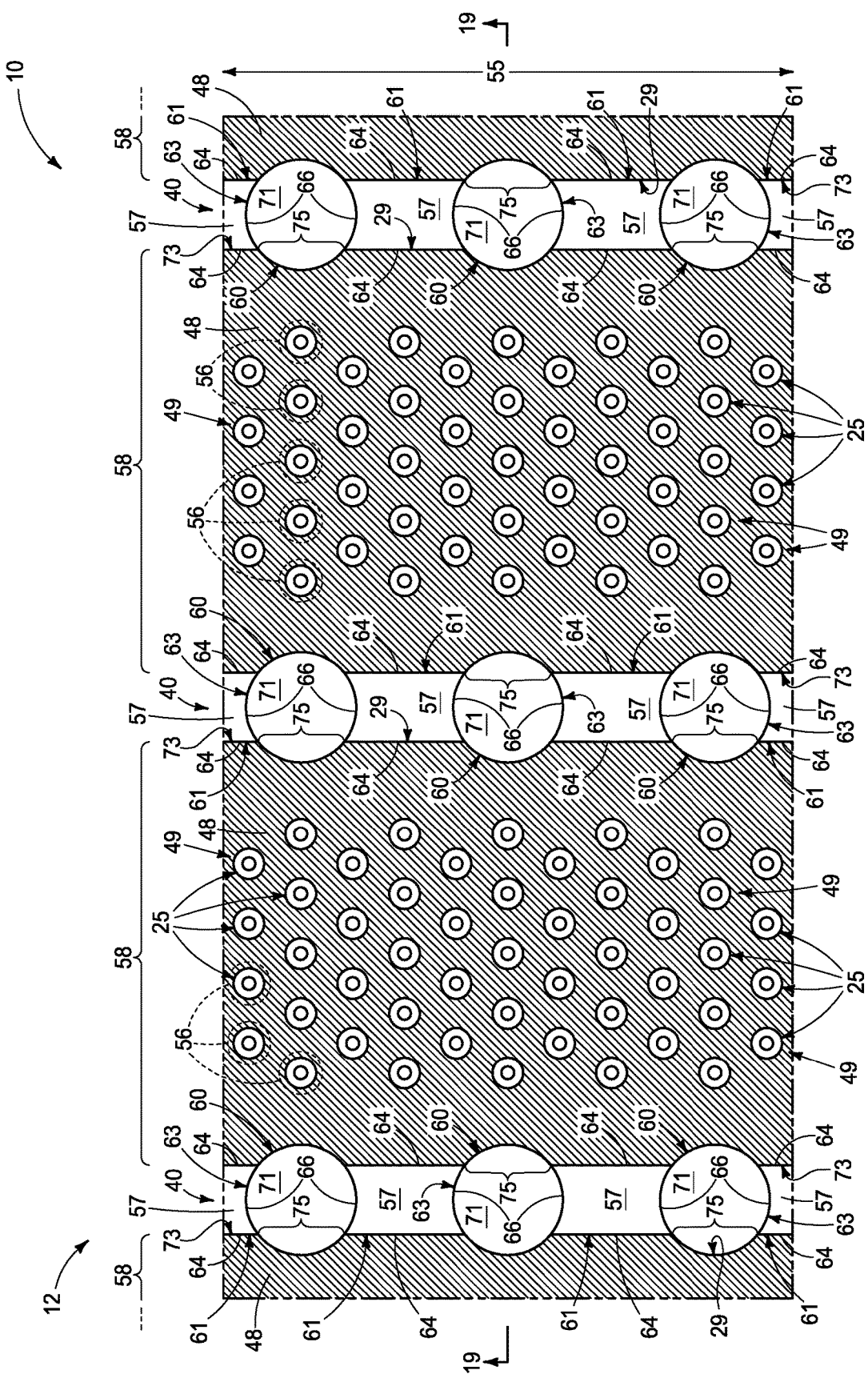
Figure 19:
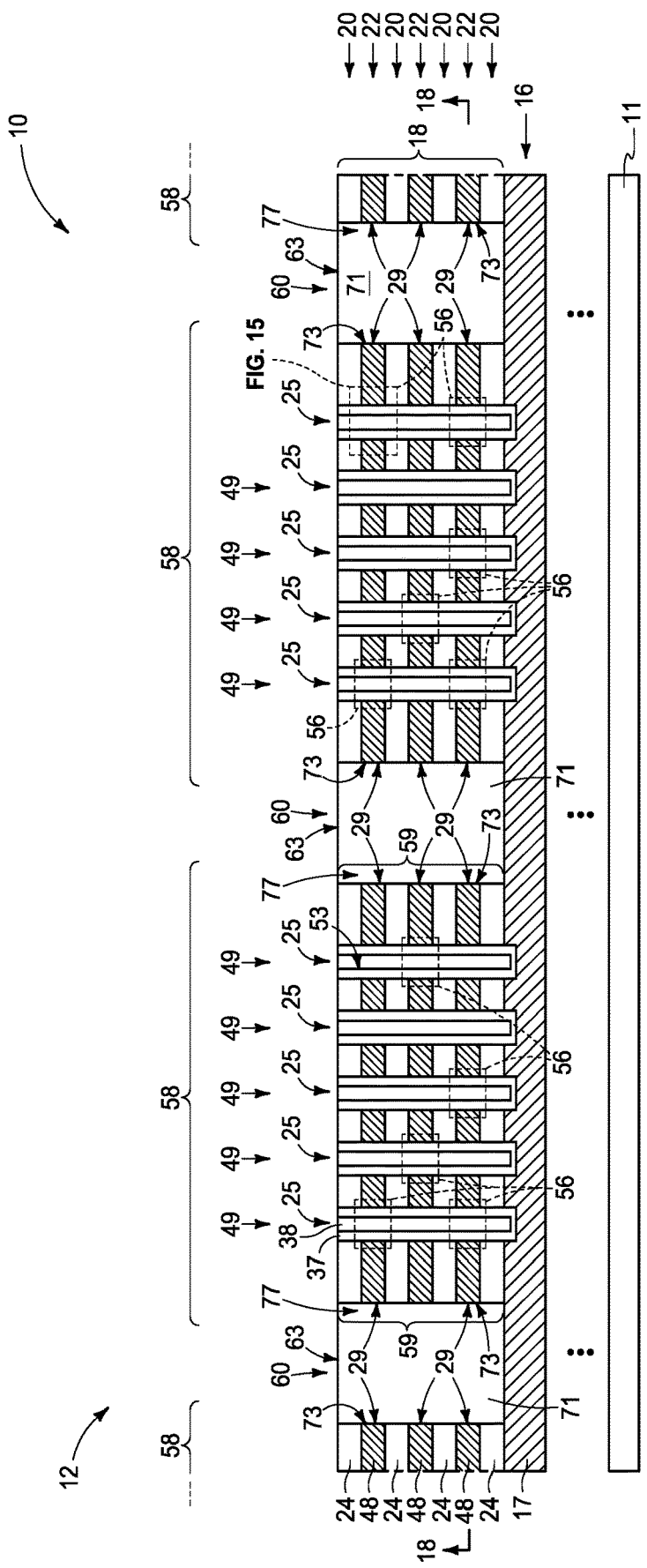
Figure 20:
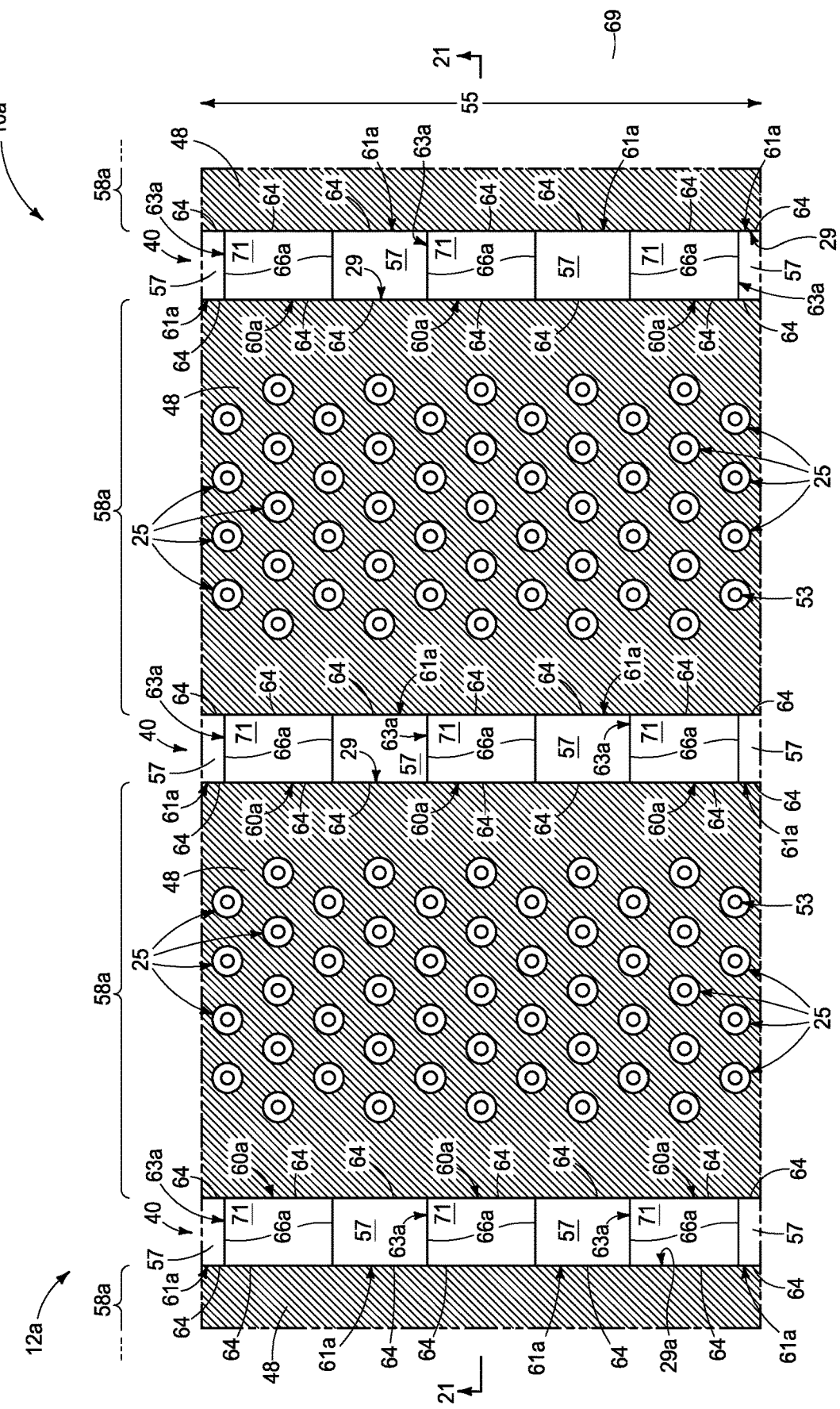
Figure 21:
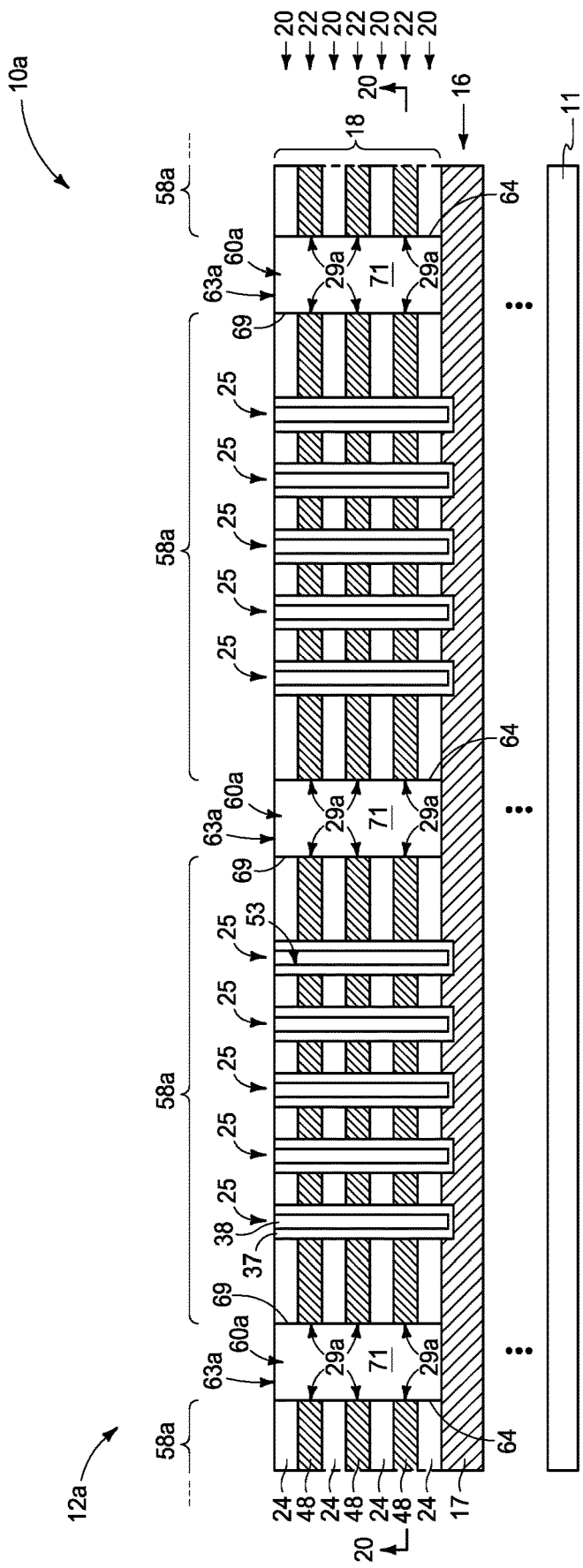

FIGS. 16 and 17 show analogous processing of construction 10a forming example conductive lines 29a.

Insulative pillars 61 may be removed (not shown), and thereafter remaining volume of trenches 40 filled with insulative material. Alternately, and as shown in FIGS. 18-21, holes 60/60a have been filled with insulative material 71, thus forming insulative pillars 63/63a. Insulative material 71 may be of the same composition or of different composition from any of that of insulative pillars 61/61a and insulative material 24. Example pillars 63 are of a circular shape in a horizontal cross-section, whereas example pillars 63a are of quadrilateral shape in a horizontal cross-section. Example pillars 63 comprise a pair of laterally-opposing concave sides 66 in a horizontal cross-section. Regardless, and in one embodiment and as shown, pillars 63 project laterally into sides 73 of conducting material 48 of conductive lines 29. In one embodiment, example conductive lines 29 in individual conductive tiers 22 comprise laterally-opposing sides 73 (FIG. 18) individually comprising longitudinally-spaced concave regions 75. In one embodiment, concave regions 75 are curved from end-to-end and, in one such embodiment, curved concave regions 75 are of constant radius for example as-shown. Alternately, concave regions 75 may have no curved portion(s) (e.g., being square, rectangular, triangular, etc., and not shown) or comprise a combination of curved and straight portions (not shown). Any other attribute(s) or aspect(s) as shown and/or described herein with respect to other embodiments may be used.

In one embodiment, memory blocks 58 have been formed to individually comprise laterally-opposing sides 59 (FIG. 19) individually comprising longitudinally-spaced concave regions 77 vertically-along stack 18. Only two sides 59 and two regions 77 are designated in FIG. 19 for clarity. In one such embodiment, such concave regions 77 are curved from end-to-end and in such one embodiment such curved concave regions 77 are of constant radius. Alternately, concave regions 77 may have no curved portion(s) (e.g., being square, rectangular, triangular, etc., and not shown) or comprise a combination of curved and straight portions (not shown). Any other attribute(s) or aspect(s) as shown and/or described herein with respect to other embodiments may be used.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

Embodiments of the invention include a memory array (e.g., 12 and/or 12a) comprising strings of memory cells (e.g., 49). Such embodiments comprise laterally-spaced memory blocks (e.g., 58 and/or 58a) individually comprising a vertical stack (e.g., 18) comprising alternating insulative tiers (e.g., 20) and conductive tiers (e.g., 22). Operative channel-material strings (e.g., 53) of memory cells (e.g., 56) extend through the insulative tiers and the conductive tiers.

In one embodiment, insulative pillars (e.g., 61/61a and/or 63/63a) are laterally-between and longitudinally-spaced-along immediately-laterally-adjacent memory blocks. The pillars are directly against conducting material (e.g., 48) of conductive lines (e.g., 29) in the conductive tiers. In one embodiment, the pillars (e.g., 63) are everywhere larger in horizontal cross-section than the channel-material strings. Any other attribute(s) or aspect(s) as shown and/or described herein with respect to other embodiments may be used.

In one embodiment, insulative pillars (e.g., 61/61a and/or 63a) are laterally-between and longitudinally-spaced-along immediately-laterally-adjacent memory blocks. The pillars comprise a pair of planar laterally-opposing sides (e.g., 64) in a horizontal cross-section. Any other attribute(s) or aspect(s) as shown and/or described herein with respect to other embodiments may be used.

In one embodiment, insulative pillars (e.g., 61) are laterally-between and longitudinally-spaced-along immediately-laterally-adjacent memory blocks. The pillars comprise a pair of laterally-opposing concave sides (e.g., 66) in a horizontal cross-section. Any other attribute(s) or aspect(s) as shown and/or described herein with respect to other embodiments may be used.

In one embodiment, conductive lines (e.g., 29, 29a) in the individual conductive tiers individually comprise laterally-opposing sides (e.g., 73) individually comprising longitudinally-spaced concave regions (e,g., 75). Any other attribute(s) or aspect(s) as shown and/or described herein with respect to other embodiments may be used.

In one embodiment, the memory blocks individually comprise laterally-opposing sides (e.g., 59) individually comprising longitudinally-spaced concave regions (e.g., 77) vertically-along the stack, Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal, Further, "extend(ing) devotionally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Insulative pillars are laterally-between and longitudinally-spaced-along immediately-laterally-adjacent of the memory blocks. The pillars are directly against conducting material of conductive lines in the conductive tiers.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Insulative pillars are laterally-between and longitudinally-spaced-along immediately-laterally-adjacent of the memory blocks. The pillars comprise a pair of planar laterally-opposing sides in a horizontal cross-section.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Insulative pillars are laterally-between and longitudinally-spaced-along immediately-laterally-adjacent of the memory blocks. The pillars comprise a pair of laterally-opposing concave sides in a horizontal cross-section.

In some embodiments, a memory array comprising strings of memory cells comprises laterally-spaced memory blocks individually comprising a vertical stack comprising alternating insulative tiers and conductive tiers, Operative channel-material strings of memory cells extend through the insulative tiers and the conductive tiers. Conductive lines in individual of the conductive tiers individually comprise laterally-opposing sides individually comprising longitudinally-spaced concave regions.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. The memory blocks individually comprise laterally-opposing sides individually comprising longitudinally-spaced concave regions vertically-along the stack.

In some embodiments, a method used in forming a memory array comprising strings of memory cells comprises forming a stack comprising vertically-alternating first tiers and second tiers. Horizontally-elongated trenches are formed into the stack to form laterally-spaced memory-block regions, Fill material is formed in the horizontally-elongated trenches. Elevationally-extending holes are formed into the fill material that are longitudinally-spaced-along immediately-laterally-adjacent of the memory-block regions. The holes extend laterally all across individual of the horizontally-elongated trenches and form insulative pillars that are laterally-between and longitudinally-spaced-along the immediately-laterally-adjacent memory-block regions longitudinally-between the holes In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
   forming a stack comprising vertically-alternating first tiers and second tiers; forming horizontally-elongated trenches into the stack to form laterally-spaced memory-block regions;
   forming fill material in the horizontally-elongated trenches; and
   forming elevationally-extending holes into the fill material that are longitudinally-spaced-along immediately-laterally-adjacent of the memory-block regions, the holes extending laterally all across individual of the horizontally-elongated trenches and forming insulative pillars that are laterally-between and longitudinally-spaced-along the immediately-laterally-adjacent memory-block regions longitudinally-between the holes, the insulative pillars being directly against conducting material of conductive lines in the first tiers in a finished-circuitry construction, the insulative pillars extending through all of the alternating first and second tiers and comprising a vertical and central insulative core that extends through all of the alternating first and second tiers.

2. The method of claim 1 comprising, through the holes, isotropically etching away and replacing sacrificial material that is in the first tiers with the conducting material of individual of the conductive lines.

3. The method of claim 1 comprising forming individual memory cells of the strings of memory cells to comprise channel material of operative channel-material strings in the memory-block regions, a gate region that is part of a conductive line in individual of the first tiers, and a memory structure laterally-between the gate region and the channel material of the operative channel-material strings in the individual first tiers, conducting material of the first tiers being formed after forming the holes.

4. The method of claim 1 comprising forming individual memory cells of the strings of memory cells to comprise channel material of operative channel-material strings in the memory-block regions, a gate region that is part of a conductive line in individual of the first tiers, and a memory structure laterally-between the gate region and the channel material of the operative channel-material strings in the individual first tiers, the forming of the horizontally-elongated trenches being through the conducting material of the first tiers.

5. The method of claim 1 comprising forming operative channel-material strings through the second tiers and the first tiers in the memory-block regions before forming the horizontally-elongated trenches.

6. The method of claim 1 comprising forming operative channel-material strings through the insulative tiers and the first tiers in the memory-block regions after forming the horizontally-elongated trenches.

7. The method of claim 1 comprising forming the holes to be vertical or within 10° of vertical.

8. The method of claim 1 comprising filling the holes with insulative material.

9. The method of claim 1 comprising forming the holes to extend laterally-beyond the fill material.

10. The method of claim 9 comprising forming the holes to be of a circular shape in a horizontal cross-section.

11. The method of claim 9 comprising forming the holes to be of a quadrilateral shape in a horizontal cross-section.

12. The method of claim 1 comprising forming the holes to not extend laterally-beyond the fill material.

13. The method of claim 12 comprising forming the holes to have planar laterally-opposing sides that are directly against insulative material of the second tiers.

14. The method of claim 12 comprising forming the holes to have planar laterally-opposing sides that are directly against material of the first tiers.

15. The method of claim 1 wherein the concave regions have no curved portion.

16. The method of claim 1 wherein the concave regions have a combination of curved and straight portions.

17. A method used in forming a memory array comprising strings of memory cells, comprising:
    forming a stack comprising vertically-alternating first tiers and second tiers;
    forming horizontally-elongated trenches into the stack to form laterally-spaced memory-block regions;
    forming fill material in the horizontally-elongated trenches; and
    forming elevationally-extending holes into the fill material that are longitudinally-spaced-along immediately-laterally-adjacent of the memory-block regions, the holes extending laterally all across individual of the horizontally-elongated trenches to form a pair of first insulative pillars laterally-between and longitudinally-spaced-along immediately-laterally-adjacent of the memory block regions by one of the holes;
    filling the holes with insulative material and to form a second insulative pillar in the one hole; and
    the first and second insulative pillars being directly against conducting material of conductive lines in the first tiers in a finished-circuitry construction, the first and second insulative pillars being of different compositions relative one another and being directly against one another, the first insulative pillars being everywhere homogenous horizontally in a horizontal cross-section.

18. The method of claim 17 wherein the first insulative pillars are everywhere homogenous from top-to-bottom.

19. The method of claim 17 wherein the second insulative pillar is everywhere homogenous horizontally in the horizontal cross-section.

20. The method of claim 19 wherein the first insulative pillars are everywhere homogenous from top-to-bottom.

* * * * *